United States Patent [19]

Hansotte, Jr. et al.

[11] Patent Number: 5,752,819

[45] Date of Patent: *May 19, 1998

[54] EXHAUST SYSTEM FOR HIGH TEMPERATURE FURNACE

[75] Inventors: Richard Rene Hansotte, Jr., Richmond; Dieter Klaus Neff, Cambridge; Dennis Arthur Rock, St. Albans; Jeffrey Alan Walker, Hyde Park; Roland Michael Wanser, Bolton, all of Vt.

[73] Assignee: International Business Machines Corporation, Armonk, N.Y.

[*] Notice: The term of this patent shall not extend beyond the expiration date of Pat. No. 5,567,149.

[21] Appl. No.: 703,240

[22] Filed: Aug. 26, 1996

Related U.S. Application Data

[63] Continuation of Ser. No. 355,571, Dec. 14, 1994, Pat. No. 5,567,149, which is a continuation of Ser. No. 7,699, Jan. 22, 1993, Pat. No. 5,407,349.

[51] Int. Cl.⁶ ........................................ F27D 3/12
[52] U.S. Cl. .......................... 432/241; 432/5; 432/6; 432/156; 432/253
[58] Field of Search ...................... 432/5, 6, 37, 156, 432/241, 253; 118/725; 110/186, 101 C, 101 CF

[56] References Cited

U.S. PATENT DOCUMENTS

| | | | |
|---|---|---|---|
| 4,195,666 | 4/1980 | Goetz et al. | 137/625.4 |
| 4,943,235 | 7/1990 | Nakao et al. | 432/205 |
| 4,976,610 | 12/1990 | Yates | 432/11 |
| 4,992,044 | 2/1991 | Philipossian | 432/253 |
| 5,035,611 | 7/1991 | Neubecker et al. | 432/176 |
| 5,064,367 | 11/1991 | Philipossian | 432/253 |
| 5,088,922 | 2/1992 | Kakizaki et al. | 432/152 |
| 5,118,286 | 6/1992 | Sanin | 432/253 |
| 5,174,745 | 12/1992 | Kim | 432/241 |
| 5,378,145 | 1/1995 | Ono et al. | 432/152 |

FOREIGN PATENT DOCUMENTS

| | | | |
|---|---|---|---|
| 63-238281 | 10/1988 | Japan | H01L 21/31 |
| 63-304620 | 12/1988 | Japan | H01L 21/22 |
| 1-207927 | 8/1989 | Japan | H01L 21/22 |

*Primary Examiner*—Harold Joyce
*Assistant Examiner*—Jiping Lu
*Attorney, Agent, or Firm*—Heslin & Rothenberg, P.C.

[57] ABSTRACT

An exhaust system for use with a high temperature furnace used to perform oxidation and/or annealing operations of the type used in semiconductor fabrication. The exhaust system is designed to permit the furnace to be used with a controlled environment chamber surrounding the entry to the process chamber of the furnace. The exhaust system allows a relatively high velocity flow of exhaust gas from the process chamber through the exhaust system to occur when a positive pressure (e.g., annealing) operations are performed. Such high velocity flow prevents (a) backstreaming and (b) the accumulation of non-uniform concentrations of exhaust gases in the exhaust system, thereby permitting the accurate monitoring of the concentration of a selected gas in the exhaust system. Based on such monitoring, the opening of the door to the process chamber of the furnace may be prevented when the concentration of the selected gas exceeds a predetermined level. Preferably, all portions of the exhaust system potentially exposed to process chamber gases are made from quartz.

2 Claims, 5 Drawing Sheets

EXHAUST SYSTEM FOR HIGH TEMPERATURE FURNACE

This application is a continuation of prior application Ser. No. 08/355,571 filed Dec. 14, 1994, now U.S. Pat. No. 5,567,149 which is a continuation of prior application Ser. No. 08/007,699, filed on Jan. 22, 1993, now U.S. Pat. No. 5,407,349.

FIELD OF THE INVENTION

The present invention relates to high temperature oxidation/anneal furnaces of the type used in semiconductor fabrication processes and, more particularly, to exhaust systems through which exhaust gases are removed from such furnaces.

BACKGROUND OF THE INVENTION

Horizontal oxidation/anneal furnaces have been widely used in the fabrication of semiconductor devices. As described in U.S. Pat. No. 4,992,044 to Philipossian, it is known to use a scavenger ring exhaust system to capture exhaust gases that escape from the process chamber of a horizontal furnace when the door to such furnace is opened. The scavenger ring comprises an annular chamber surrounding the opening to the process chamber of the furnace, with the radially inner wall of the scavenger ring including a plurality of openings through which exhaust gases are drawn into the chamber. Atmospheric gases are drawn into the scavenger ring at a sufficient volume flow rate to ensure that gases present in the furnace process chamber are not released into the surrounding environment. Evacuation of such exhaust gases is required to protect operators of the furnace as well as adjacent portions of the tool from corrosive exhaust gases present in the process chamber of the furnace.

For a variety of reasons, including conservation of floor space and increased control of oxidation and annealing operations, the semiconductor industry has begun using vertical oxidation/anneal furnaces in place of horizontal oxidation/anneal furnaces. As the size of structures in integrated circuit (IC) chips has continued to decrease, it has, in certain circumstances, become necessary to control the environment surrounding the door of the oxidation/anneal furnace to minimize the contaminate particle count in such region. To this end, sealed chambers having a controlled environment are used beneath vertical oxidation/anneal furnaces, with the process chamber of the furnace being coupled with the controlled environment via a load lock. It tends to be difficult to use a scavenger ring exhaust system surrounding the opening of a furnace process chamber when the furnace is associated with a chamber having a controlled environment because the flow rate of such exhaust system is typically sufficiently great as to "sweep away" the controlled environment.

Challenges exist in designing the exhaust system for furnaces in which high temperature oxidation operations are to be performed due to the presence of gaseous hydrochloric acid (HCl) in the process chamber of such furnaces. As used in the specification, including the claims, "gaseous hydrochloric acid" (also referred to as "gaseous HCl" or "HCl gas") means moist hydrogen chloride vapor. The latter is created when dry hydrogen chloride vapor and steam are introduced into the process chamber of the furnace. The phrase "gaseous hydrochloric acid," as used herein, does not mean liquid hydrochloric acid, although both gaseous hydrochloric acid and liquid hydrochloric acid may exist within a given portion of known exhaust systems for oxidation furnaces.

HCl gases rapidly corrode materials, e.g., stainless steel, of the type used in exhaust systems for high-temperature furnaces where HCl gases are not present. As a result of this corrosion problem, quartz has been used in the fabrication of exhaust systems used with furnaces in which high temperature oxidation operations are to be performed, as disclosed in U.S. Pat. Nos. 4,943,235 to Nakao et al., 4,976,610 to Yates and 5,088,922 to Kakizaki et al.

The Kakizaki et al. reference describes a ganged exhaust system intended for use with a plurality of vertical oxidation furnaces, which exhaust system is designed to minimize variations in flow rate between various portions of the exhaust system. This control of the exhaust flow rate is achieved (1) via a pair of valves positioned in each vertical tube of the exhaust system that are operated based on the manifold pressure in the tube adjacent such valves and (2) by an air intake unit positioned between the valves for coupling the interior of the tube with the atmosphere. The valves are apparently positioned in a portion of the exhaust system where the exhaust gases have cooled sufficiently to condense, with a trap being positioned upstream of the valves to capture condensation. The furnace with which the Kakizaki et al. exhaust system is designed to be used is apparently only intended for negative pressure processes, e.g., oxidation processes, and not positive pressure operations such as annealing. Furthermore, although not shown or described, it appears that a scavenger ring exhaust system is likely used in combination with the Kakizaki et al. exhaust system to prevent the release into the environment of gases present in the process chamber.

Valves have been designed for controlling the flow of exhaust gases in the exhaust systems of high temperature furnaces. One such valve assembly, described in U.S. Pat. No. 5,035,611 to Neubecker et al., includes an elongate member that is designed for axial movement between open and closed positions.

SUMMARY OF THE INVENTION

The present invention is an exhaust system for a high-temperature furnace having a process chamber in which gaseous hydrochloric acid and other corrosive gases are present. The exhaust system includes a first member having first and second ends and an elongate hollow interior defined by an inner wall. The first end of the first member is couplable with the exhaust port of the furnace so that gases may be drawn from the process chamber of the furnace into the interior of the first member. The first member has an outlet aperture for coupling the interior of the first member with the interior of the another member of the exhaust system.

The exhaust system also includes a valve assembly that is coupled with the first member and is operable between open and closed positions. The valve assembly is designed to restrict to a predetermined amount the extent of fluid communication between the outlet port of the first member and the interior of the first member when the valve assembly is in the closed position. Portions of the valve assembly and the first member are made from materials that substantially do not react chemically and physically with gaseous hydrochloric acid.

Another aspect of the present invention is a method of controlling the operation of a high-temperature furnace used with a controlled environment chamber so as to prevent the release of a selected gas, e.g., gaseous hydrochloric acid, present in the process chamber of the furnace into the environment surrounding the furnace. The method involves maintaining the process chamber and controlled environment chamber at a positive pressure with respect to the environment in which the furnace is located. As the next step in the process, the concentration of a selected gas present in the process chamber of the furnace is monitored. Such monitoring is performed in a portion of the exhaust system that is in fluid communication with the process chamber, with exhaust gases being drawn through such portion so that a circumferentially substantially uniform flow of exhaust is maintained in such portion. Finally, the furnace door is moved from the closed position to the open position only when the concentration of said gas is less than a predetermined amount.

BRIEF DESCRIPTION OF THE DRAWINGS

For a fuller understanding of the nature and objects of the present invention reference should be made to the following detailed description taken in connection with the accompanying drawings wherein.

DETAILED DESCRIPTION OF THE INVENTION

Figure 1:
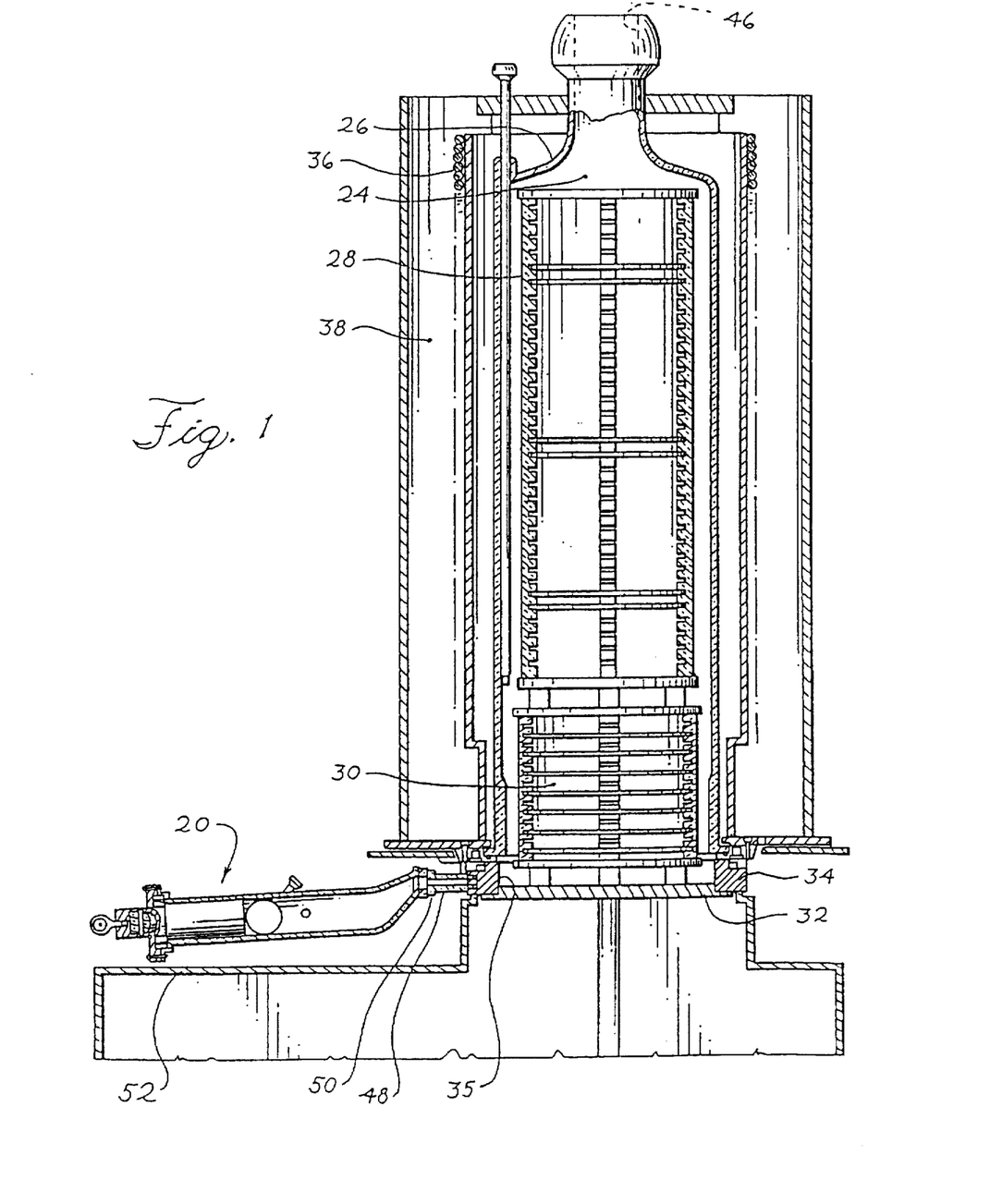
FIG. 1 is a schematic cross-sectional side elevation view of a vertical furnace, an associated controlled-environment chamber, and a portion of the exhaust system of the present invention.

Referring to FIG. 1, the present invention is an exhaust system 20 designed for use with a high temperature furnace 22 of the type used in the semiconductor industry. Furnace 22 includes a process chamber 24 inside elongate inner shell 26. As described hereinafter and illustrated in FIG. 1, furnace 22 is designed so that the longitudinal axis of inner shell 26 extends vertically. However, furnace 22 may be a horizontal furnace (not shown) where the longitudinal axis of the inner shell extends horizontally.

Figure 8:
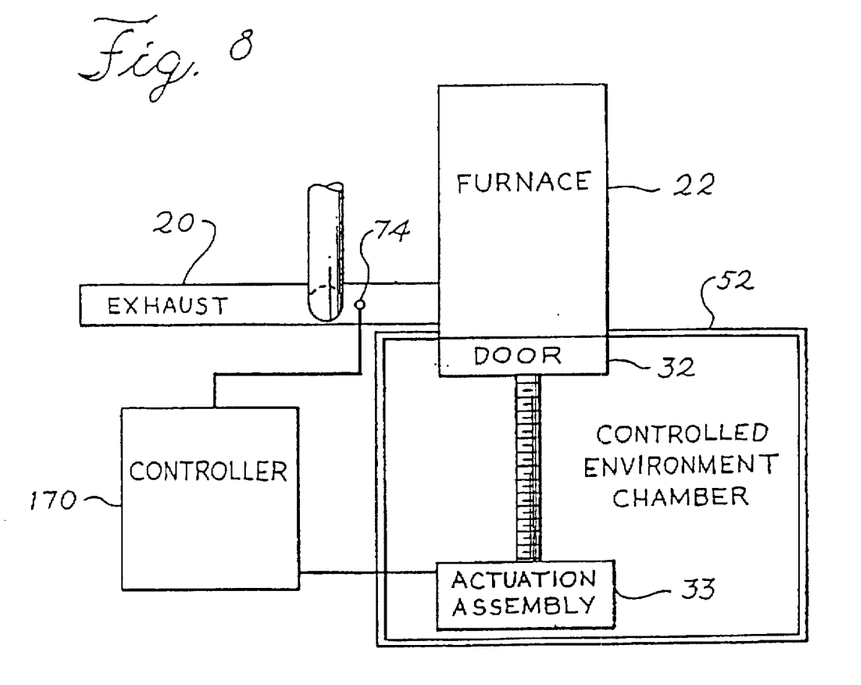
FIG. 8 is a schematic illustration of the furnace controlled environment chamber, exhaust system, and door interlock.

Wafers (not shown) to be subjected to high temperature treatments such as oxidation and annealing are supported in an elongate boat 28 sized to fit in process chamber 24. Boat 28 is supported on a heat baffle 30 that is attached to door 32. As illustrated in FIGS. 1 and 8, boat 28, baffle 30 and door 32 are moved as a unit along the longitudinal axis of the boat by an actuation assembly 33 (FIG. 8) attached to door 32. Actuation assembly 33 may comprise a conventional hydraulic, mechanical, electro-mechanical or other system for causing door 32 to move between open and closed positions upon receipt of appropriate instructions provided via a control panel (not shown) or a controller 170 (FIG. 8) coupled with the actuation assembly, as discussed hereinafter. When actuation assembly 33 has moved door 32 to the closed position, as illustrated in FIG. 1, door 32 engages seal 34 that surrounds the opening 35 to process chamber 24, thereby sealing process chamber 24 from the controlled environment chamber 52 (discussed hereinafter), or from the environment in which the furnace is located when chamber 52 is not used. When actuation assembly 33 has moved door 32 to the open position (not shown) where the door is spaced from seal 34 and boat 28 is completely withdrawn from process chamber 24, the latter is in fluid communication with (1) controlled environment chamber 52, if used, or (2) the environment in which furnace 22 is located, if chamber 52 is not used.

Furnace 22 also includes a heating element 36 positioned between inner shell 26 and outer shell 38. Heating element 36 is designed to maintain the temperature in process chamber 24 at a temperature in the range of 300–1200° C. Process gases are introduced into process chamber 24 via inlet 46 at the top of process chamber 24 and are exhausted from the process chamber via outlet 48 positioned at the bottom of the process chamber. Outlet 48 terminates at a flange 50 to which exhaust system 20 is attached, as described hereinafter.

To reduce the possibility of contamination of wafers being processed in furnace 22, it is known to position a controlled environment chamber 52 beneath furnace 22. Chamber 52 surrounds opening 35 to process chamber 24 and is designed to isolate the opening, and hence the interior of the process chamber, from the environment in which furnace 22 is located when door 32 is opened. Upon completion of a heat treatment process, boat 28, baffle 30, and door 32 are moved into chamber 52 by actuation assembly 33 and are maintained in the chamber for a predetermined period of time before moving the wafers supported in boat 28 to the tool (not shown) used in subsequent processing of the wafers.

The environment in process chamber 52 is typically controlled so that less than 10 ppm of oxygen is present in the chamber and a class 1 cleanroom contaminate level is maintained in the chamber. The controlled environment is achieved either by maintaining a suitable flow of nitrogen or other appropriate gas through the chamber or maintaining the chamber at a positive pressure with respect to the environment in which the chamber is located so as to prevent the introduction of oxygen and particulate material.

As described hereinafter, exhaust system 20 is designed to support the operations of a vertical oxidation/anneal furnace having a controlled environment chamber positioned beneath the furnace. However, exhaust system 20 may be used with vertical furnaces not having a controlled environment chamber associated therewith. Also, exhaust system 20 may be used with horizontal furnaces, either with or without an associated controlled environment chamber.

Exhaust system 20 comprises a series of hollow, elongate members, typically tubes, of varying cross-sectional configuration through which gases in process chamber 24 may be evacuated. The specific size and arrangement of the hollow members will vary depending upon the furnace with which exhaust system 20 is used, the exhaust flow rate of the house exhaust system (not shown) with which exhaust system 20 is coupled and other factors. The embodiment of exhaust system 20 described hereinafter and illustrated in the Figures is merely exemplary and reflects design choices that were made to permit the exhaust system (1) to be coupled with a vertical oxidation/anneal furnace of the type manufactured by General Signal Thinfilm Company and (2) to be coupled with a house exhaust having a negative pressure of between about −3 to −12 cm H$_2$O. Alternative designs permitting the exhaust system to be used with different furnaces and house exhaust systems having a different flow rate are encompassed by the present invention when designed in accordance with the principles of the invention described hereinafter.

Referring to FIGS. 1–5, exhaust system 20 comprises a primary exhaust tube 60 having a hollow interior defined by an inner wall 62 (FIG. 5) that has a circular cross-sectional configuration along the majority of its length. Primary tube 60 has a proximal end that terminates in a flange 64 which is sized to engage flange 50 of outlet 48 of furnace 22. Flange 64 is maintained in tight engagement with flange 50 via bolts 66 or other appropriate attachment means so as to ensure exhaust gases drawn from process chamber 24 into primary tube 60 do not escape past the junction of flanges 50 and 64. The distal end of tube 60 terminates in flange 68.

Figure 5:
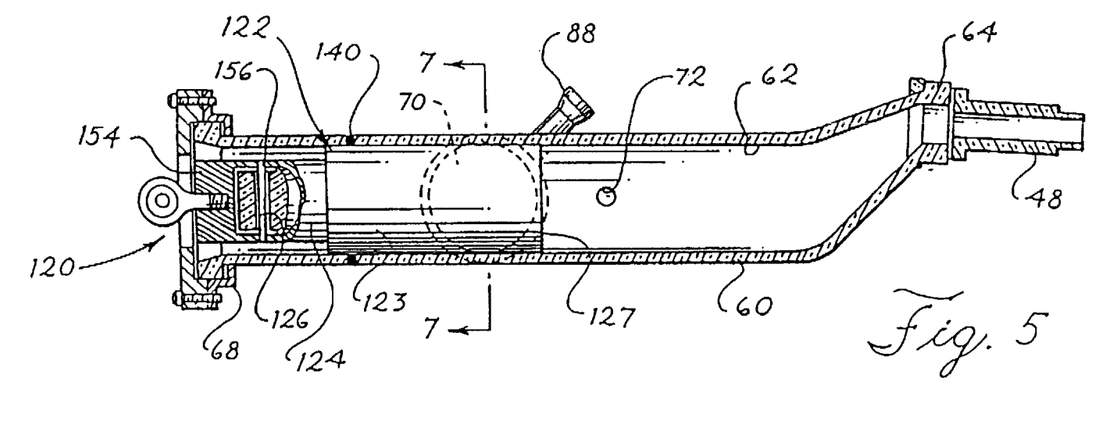
FIG. 5 is a cross-sectional side elevation view of the primary tube and the actuation assembly, with the valve being illustrated in the closed position.

Preferably, tube 60 is made entirely of quartz to prevent the corrosion thereof by hydrochloric acid (HCl) gases which are often present in the exhaust gases to be withdrawn from process chamber 24. Although not as HCl-resistant as quartz, other materials such as polyvinylidenefluoride (PVDF) tubing or polytetrafluoroethylene (PTFE)-coated stainless steel tubing may also, under certain circumstances, be used for primary exhaust tube 60.

Primary tube 60 includes a circular aperture 70 (FIG. 5) extending through the wall thereof approximately midway along the length of the tube. Tube 60 also includes one or more relatively small holes 72 (FIG. 5) extending through the wall of the tube between aperture 70 and the flange 64 of tube 60. One of the holes 72 is used to receive an HCl sensor 74 (FIGS. 2 and 8) that is used to measure the concentration of gaseous HCl in tube 60, and hence in process chamber 24, as discussed hereinafter. Other sensors, such as a pressure sensor (not shown) may be received in another one of holes 72.

Figure 2:
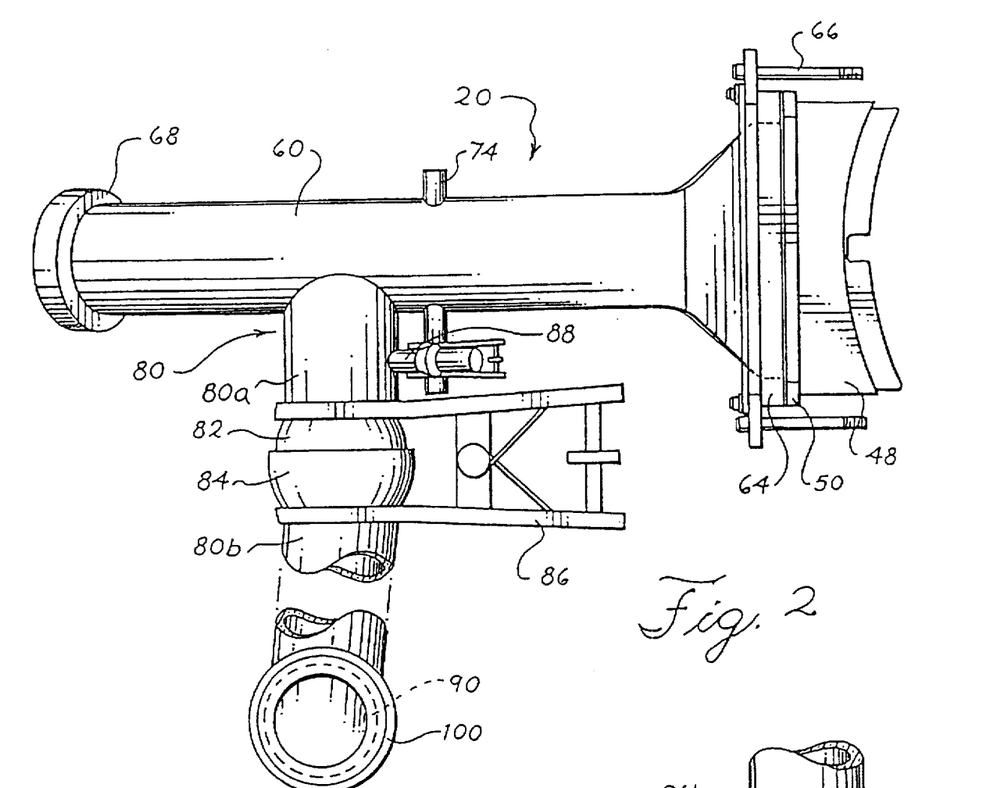
FIG. 2 is a top view of the exhaust system of the present invention, with a vertical leg of the system being illustrated in cross section.

A secondary tube 80, also preferably made entirely of quartz, is attached to primary tube 60 at aperture 70 such that the interior of tube 80 is coupled with the interior of tube 60. To accommodate the movement of the tubes of exhaust system 20 relative to one another that occurs due to thermal expansion and contraction of the tubes and portions of furnace 22 attached thereto, tube 80 is preferably made of two portions, portion 80a (FIG. 2) and portion 80b (FIG. 2). Tube portion 80a terminates in a male ball joint section 82 and tube portion 80b commences with a female ball joint section 84 which is sized to receive section 82 so that an air-tight seal therebetween may be achieved. Clamp 86 is provided for retaining ball joint sections 82 and 84 in air-tight sealing relationship. Ball joint section 82 and 84 are preferably made entirely of quartz and typically are integral with the tube portions to which they are attached.

If desired, a relatively small tube 88 (FIG. 2) may be coupled with tube 80. Tube 88 may be used to supply dilution gases, e.g., nitrogen, to the exhaust gases being drawn through tube 80.

Tube portion 80b is also attached to tertiary tube 96 so that the interior of tube 80 is coupled with the interior of tube 96.

Tube 96 preferably includes a drain port 98 (FIG. 3) that is used to drain from the exhaust system the liquid generated when exhaust gases condense in the interior of tube 96. To facilitate the removal of liquid through drain port 98, tube 96 is preferably positioned so that its long axis extends substantially vertically (i.e., parallel to the pull of gravity) to encourage the flow of exhaust gas condensate toward drain 98. Like tube 80, tube 96 preferably consists of two portions, portion 96a and portion 96b. Such two-part construction is preferred to allow relative movement between the tubes of system 20, as discussed above. Preferably tube portion 96a is made entirely of quartz and terminates in female ball joint end 100. Assuming the length of tube 80 and tube portion 96a are such that most of the HCl gas present in the exhaust stream from furnace 22 has condensed into liquid hydrochloric acid by the time such gas reaches female ball joint 100, tube portion 96b may be made from materials other than quartz, e.g., coated stainless steel or PVDF. Tube portion 96b includes a male ball joint section 102 that is sized for receipt in female ball joint section 100 such that an air-tight seal is achieved between tube portions 96a and 96b. A clamp (not shown) similar to clamp 86 is used to ensure ball joint sections 100 and 102 remain in air tight engagement with one another. Tube portion 96b is designed to be attached to a house exhaust system (not shown).

As those of ordinary skill in the art will appreciate, the inside diameter, length, and wall thickness of tubes 60, 80 and 96 will vary as a function of the particular environment in which exhaust system 20 is used. The structure surrounding the furnace 22 with which exhaust 20 is used will affect the relative placement of the tubes and the negative pressure of the house exhaust system (not shown) with which exhaust system 20 is coupled will influence the selection of the inside diameter of tubes 60, 80 and 96.

Figure 3:
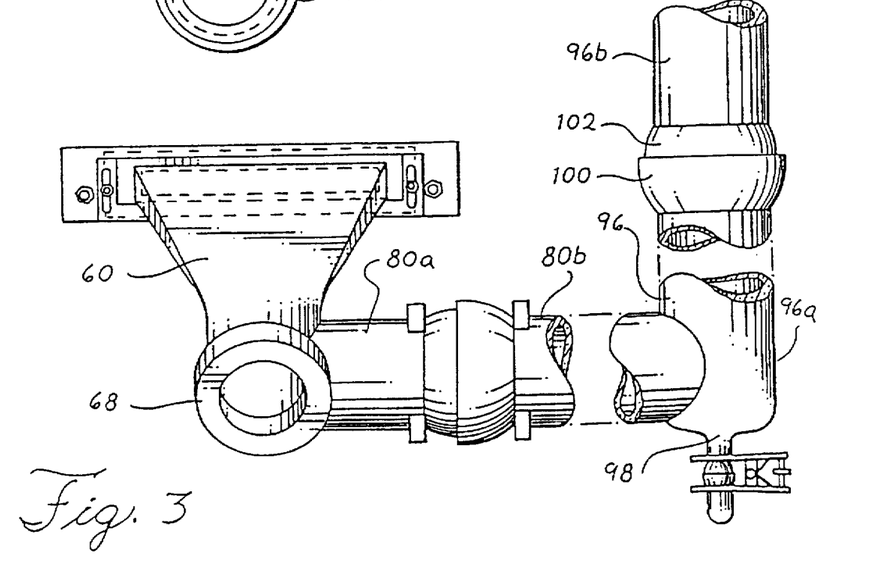
FIG. 3 is a front elevation view of the exhaust system of the present invention.

In one embodiment of the invention, where exhaust system 20 is designed for use with (1) a vertical oxidation/anneal furnace made by General Signal Thinfilm Company and (2) a house exhaust having a negative pressure ranging from about −5 to −10 cm H$_2$O, tubes 60, 80 and tube portion 96a are made entirely of quartz, have a wall thickness of about 6 mm, and an inside diameter of about 50 mm. Tube 60 has a length of about 360 mm, tube 80, when assembled as illustrated in FIGS. 2 and 3, has an overall length of about 450 mm and tube portion 96a has an overall length of about 300 mm.

Referring to FIGS. 4–7, exhaust system 20 includes a valve assembly 120 for selectively restricting the extent of fluid communication between the interior of tube 60 and the interior of tube 80. As described hereinafter, when valve assembly 120 is in the open position, the interior of tube 60 is fluidly coupled with the interior of tube 80 and aperture 70 is in unrestricted fluid communication with the interior of tube 60. When valve assembly 120 is in the closed position, the extent of fluid coupling between the interior of tube 60 and the interior of tube 80 is limited due to restriction in the extent of fluid communication between the interior of tube 60 and aperture 70.

Figures 6, 7:
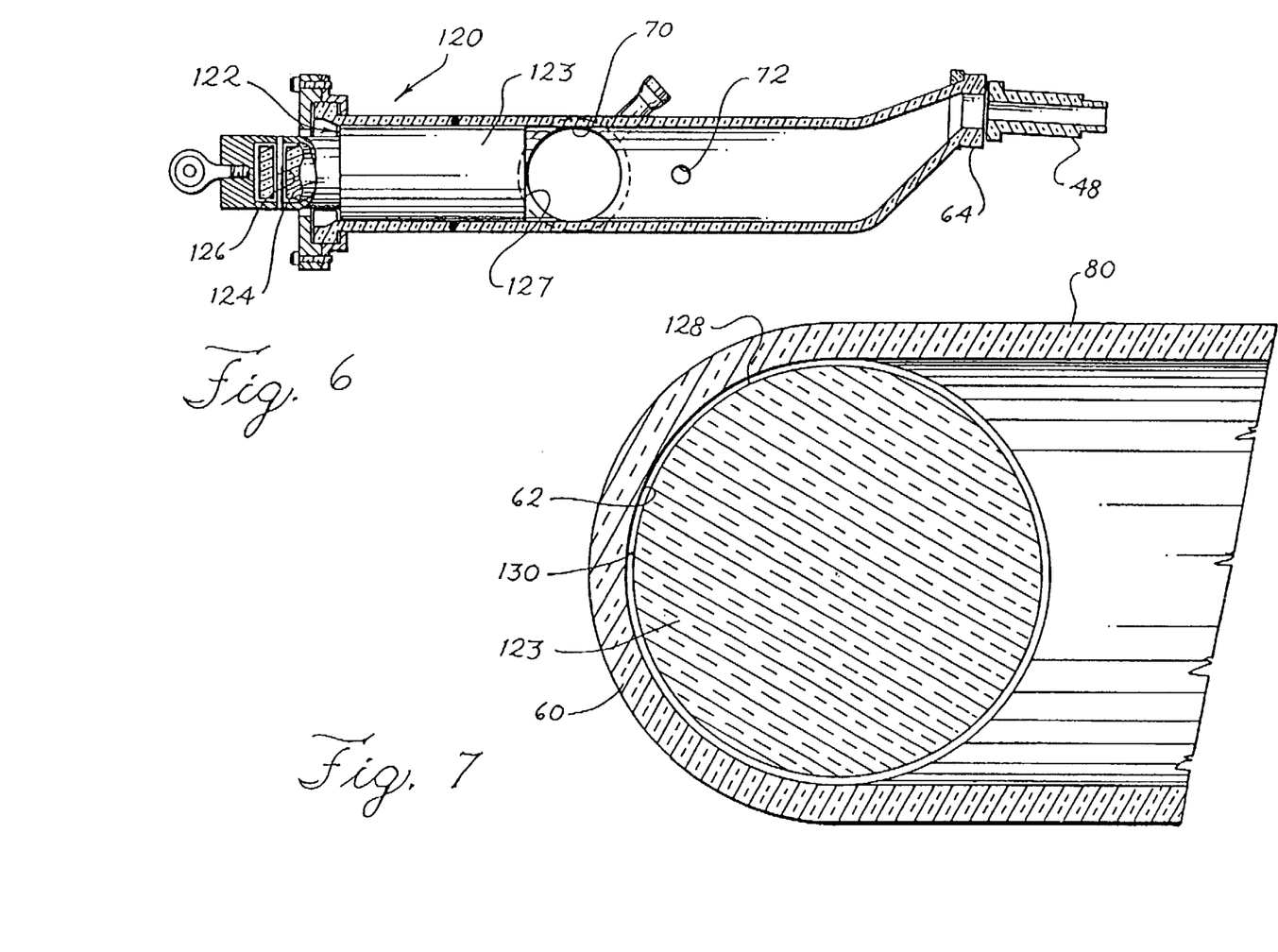
FIG. 6 is similar to FIG. 5, except that the valve is illustrated in the open position.
FIG. 7 is a cross-sectional view of the exhaust system taken along line 7—7 in FIG. 5, with the gap between the peripheral surface of the piston and the inner wall of the exhaust tube being exaggerated for purposes of illustration.

In the preferred embodiment, valve assembly 120 comprises a piston 122 that is positioned for slidable movement in tube 60. Preferably, piston 122 is solid and is made entirely of quartz, although portions of the piston may be hollow and other materials not subject to corrosion when exposed to HCl gas may also be used. Piston 122 includes a large diameter front portion 123 and a reduced diameter rear portion 124 having a radial bore 126 extending therethrough. Front portion 123 includes a front face 127 (FIGS. 5 and 6). The axial length of front portion 123 is greater than the diameter of aperture 70, and preferably has a length of about twice the diameter of aperture 70. By sizing front portion 123 in this manner, piston 122 may be moved to the position illustrated in FIG. 5 (the "closed" position) where the entire aperture 70 confronts and is substantially blocked by large diameter portion 123 of piston 122, as discussed in more detail hereinafter.

It is important that the outside diameter of piston portion 123 be properly sized relative to the inside diameter of tube 60, i.e., the diameter of inner wall 62, to obtain the full benefit of the present invention. An important feature of the present invention is that when piston 122 is in the closed position illustrated in FIG. 5, the position selected when furnace 22 is used for annealing and other operations requiring the process chamber 24 to be positively pressured (e.g., +5 cm of $H_2O$) with respect to the environment in which furnace 22 is located, a high velocity flow of exhaust gases continues to be withdrawn from the interior of tube 60 via aperture 70. This exhaust flow is achieved by sizing piston portion 123 so that a gap 130 (FIG. 7) exists between (1) the peripheral surface 128 (FIG. 7) of portion 123 and (2) inner wall 62 of tube 60. The size of gap 130 has been exaggerated in FIG. 7 for purposes of illustration. It is through this gap 130 that the high velocity flow of exhaust gases is maintained when piston 122 is in the closed position.

The size of gap 130, i.e., the radial dimension of gap 130 as measured along a radius extending perpendicular to the longitudinal axis of tube 60, will vary as a function of the furnace with which exhaust system 20 is coupled, the inside diameters of tubes 60, 80, and 96, and the negative pressure of the house exhaust system (not shown) with which exhaust system 20 is coupled. However, the size of gap 130 is selected so that a relatively high velocity flow of exhaust gases is maintained through aperture 70 when the valve assembly is in the closed position. This high velocity flow creates a pressure differential between the interior of tube 60 and the interior of tube 80 that prevents the backstreaming of exhaust gases from the house exhaust and from tubes 80 and 96 into tube 60. Avoidance of such backstreaming is important when a previous negative pressure operation, e.g. oxidation, involved the generation of exhaust gases that are detrimental to a current process conducted at positive pressures, e.g., annealing. For instance, shortly after completion of an oxidation process, gaseous and liquid HCl may still exist in tube 80, tube 96 and the house exhaust system.

Maintenance of a relatively high velocity flow of exhaust gases through aperture 70 when valve assembly 120 is in the closed position is also desirable to ensure the concentration of exhaust gases in tube 60 is substantially the same as the concentration of exhaust gases in process chamber 24. This similarity in exhaust gas concentration occurs because the relatively high velocity flow of exhaust gases minimizes the accumulation of exhaust gases in certain portions of tube 60. The build up of exhaust gases in non-uniform concentrations in tube in 60 is further avoided by forming gap 130 so that it extends around the entire circumference of piston portion 123. By providing this gap 130, a circumferentially substantially uniform flow of exhaust gas is maintained in the interior of tube 60 between piston face 127 and the proximal end of the tube (i.e., the end where flange 64 is attached). The phrase "circumferentially substantially uniform flow" means that the volumetric rate of flow of exhaust gases passing through tube 60 is about equal, as measured at any location across a given plane extending through the interior of tube 160, perpendicular to the longitudinal axis of the tube.

When exhaust system 20 is designed for use with a furnace 22 for performing oxidation and annealing operations of the type used in semiconductor fabrication, the difference in the outside diameter of piston portion 123 and the inside diameter of inner wall 62 preferably ranges from about 0.05 mm to 0.5 mm. When exhaust system 20 is used with other furnaces, a difference in diameter between piston portion 123 and inner wall 62 as small as 0.01 mm and as large as 3 mm may be acceptable. Thus, the thickness of gap 130, as measured along a radius extending perpendicular to the longitudinal axis of tube 60, preferably varies from about 0.005 mm about 1.5 mm. In one embodiment of exhaust system 20, where the latter is designed for use with a General Signal Thinfilm Company furnace and is designed to be coupled with a house exhaust system having a negative pressure of about −5–12 cm $H_2O$, the difference between the outside diameter of piston portion 123 and the inside diameter of inner wall 62 is about 0.25 mm, i.e., gap 130 has a thickness of about 0.12 mm, as measured along a radius extending perpendicular to the longitudinal axis of tube 60.

Primary exhaust tube 60 includes an annular seal 140 (FIGS. 5 and 6) positioned in an annular recess communicating with the interior of the tube. Seal 140 is sized to surround and engage portion 123 of piston 122 so as to prevent exhaust gases present in the interior of tube 60 from escaping past the seal and out the distal end of the tube. At the same time, seal 140 must be sized to permit piston 122 to move along its longitudinal axis within tube 60. Seal 140 is positioned in tube 60 so as to always surround at least part of piston portion 123, regardless of whether the piston is in open, closed or intermediate positions, as discussed in more detail hereinafter. Seal 140 is made from a material that does not react physically or chemically with gases present in process chamber 24, e.g., viton rubber.

Figure 4:
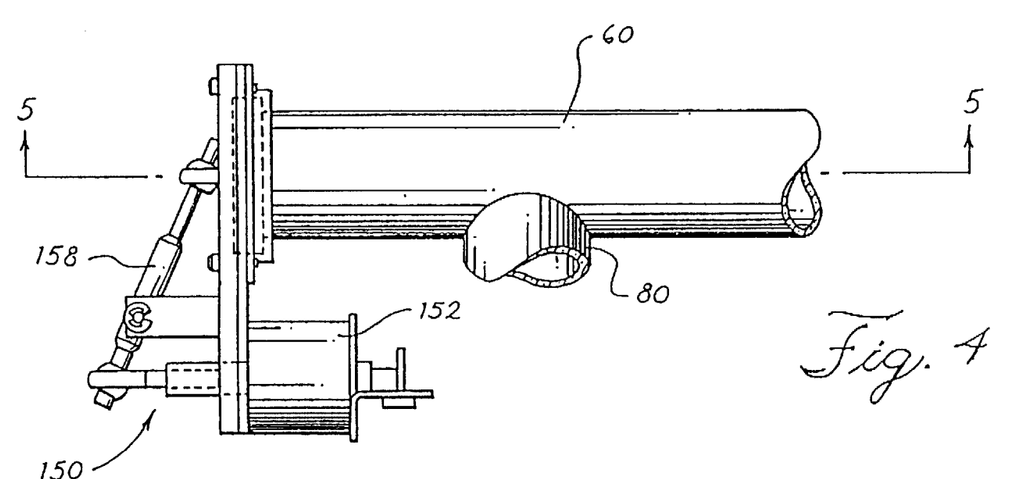
FIG. 4 is a top view of portions of the primary and secondary tubes of the exhaust system and of the actuation assembly coupled with the primary tube.

Exhaust system 20 includes an actuation assembly 150 (FIG. 4) for causing piston 122 to move between the closed position illustrated in FIG. 5, where the entire aperture 70 confronts peripheral surface 128 of piston 122, and the open position illustrated in FIG. 6, where no portion of aperture 70 confronts peripheral surface 128. In a preferred embodiment of the present invention, axial movement of piston 122 between open and closed positions is achieved by a two-way linear actuator 152, e.g. a two-way pneumatic actuator. Actuation assembly 150 also includes a yoke 154 that surrounds reduced diameter portion 124 of piston 122. Yoke 154 is attached to portion 124 by a pin 156 extending through radial bore 126 in portion 124. Linear actuator 152 is coupled with yoke 154 via a linkage assembly 158. Linkage assembly 158 is designed to transmit linear movement from actuator 152 to yoke 154 and hence to piston 122. Linkage 158 is additionally designed so that axial movement is transmitted to yoke 154 in a direction opposite the direction in which linear actuator 152 moves. Thus, as illustrated in FIG. 4, when linear actuator 152 moves to the left, yoke 154 is driven to the right and vice versa. The design of linkage 158 and the extent of longitudinal movement of linear actuator 152 must be selected to ensure that yoke 154 is driven back and forth along a longitudinal path of sufficient length to cause piston 122 to move between the closed position (FIG. 5) and the open position (FIG. 6).

As discussed above, because scavenger ring exhaust systems of the type described in U.S. Pat. No. 4,992,044 to Philipossian surround the opening to the process chamber and evacuate exhaust gases from such opening at a relatively high volume flow rate, the possibility of harmful gases such as gaseous HCl being released into the environment adjacent the opening is extremely low. However, because exhaust system 20 does not include a scavenger ring surrounding opening 35 to process chamber 24, the present invention includes an interlock system for preventing the opening of door 32 when the concentration of a selected gas(es), e.g., gaseous HCl, in process chamber 24 exceeds a predetermined level. Exhaust system 20 is fully capable of removing exhaust gases from process chamber 24 to the extent required to avoid the release of harmful gases when door 32 is opened, if operated for a sufficient period of time. The interlock only affects the operation of door 32 in the unlikely event exhaust system 20 has not been operated for a sufficient period of time to remove the harmful exhaust gas(es) from process chamber 24.

Referring to FIGS. 1, 2, 8, and 9, the primary elements of the door interlock system comprise actuation assembly 33 (FIG. 8), HCl sensor 74 (FIGS. 2 and 8), and controller 170 (FIG. 8). Actuation assembly 33 and HCl sensor 74 are coupled with controller 170 so that the output of HCl sensor 74 is provided as an input to controller 170 and output signals for controlling the operation of actuation assembly 33 are provided thereto by the controller. The latter is a conventional digital computer that is programmed in accordance with the flow diagram in FIG. 9, described in more detail hereinafter, so as to permit door 32 to be opened by actuation assembly 33 only when the concentration of a selected gas in process chamber 24 is below a predetermined level.

Although not primary components of the door interlock, the design of tube 60, tube 80, and valve assembly 120 is important to the effective functioning of the interlock. As discussed above, the presence of gap 130 surrounding piston portion 123 ensures a circumferentially substantially uniform flow of exhaust gas is maintained in the interior of tube 60. This uniform flow prevents exhaust gases from accumulating in particular regions of tube 60. If such accumulation occurred adjacent HCl sensor 74, the output of the sensor would not in all likelihood be representative of the true concentration of HCl gas in tube 60, and hence in process chamber 24. Such erroneous information from HCl sensor 74 could cause controller 170 to block the opening of door 32 even when HCl gas concentrations in process chamber 24 are sufficiently low to permit door 32 to be opened.

Assuming it is initially desired to subject wafers (not shown) supported in boat 28 to a negative pressure operation such as an oxidation process, exhaust system 20 and furnace 22 are operated in the following manner. "Negative pressure," as used herein, means a pressure that is less than the pressure of the environment in which furnace 22 is located, e.g., −5 cm H$_2$O. First, linear actuator 152 is operated so as to cause piston 122 to move to the open position illustrated in FIG. 6. Because no portion of aperture 70 is blocked by piston portion 123 when the piston is in the open position, gases present in process chamber 24 may be drawn out through exhaust outlet 48 and into tube 60, through aperture 70 and out through tubes 80 and 96, with piston 122 substantially not restricting the flow of exhaust gases through aperture 70. The volume flow rate of exhaust gases through tube 60 system will typically vary from about 10–40 l/min, although greater or lesser flow rates may occur depending upon the design and sizing of exhaust system 20 and the negative pressure of the house exhaust system with which exhaust system 20 is coupled. The length of tube 60, the placement of aperture 70 therein, and the length of tubes 80 and 96 are selected so that HCl gases introduced or created during negative pressure operations in process chamber 24 remain in the gaseous state when drawn through aperture 70. Some condensation of the HCl gas is believed to occur in tube 80, with the majority of such condensation occurring in tube 96. At typical pressures (e.g., −5 cm of H$_2$O), HCl gas condenses at around 100° C. Liquid hydrochloric acid is removed from tube 96 using drain 98, as required.

If upon completion of a negative pressure operation, e.g., the growth of a silicon oxide, it is desired to subject wafers in process chamber 24 to a positive pressure operation, e.g., annealing, actuation assembly 150 is operated to cause piston 122 to move to the closed position illustrated in FIG. 5. "Positive pressure," as used herein, means a pressure that is greater than the pressure of the environment in which furnace 22 is located, e.g., +5 cm H$_2$O. In the closed position, piston 122 substantially blocks the flow of exhaust gas through aperture 70. However, due to annular gap 130 surrounding piston portion 123, a circumferentially uniform flow of exhaust gas is maintained in tube 60. Such circumferentially uniform exhaust flow allows accurate monitoring of the HCl concentration in tube 60, and hence in process chamber 24, as discussed above.

Assuming upon completion of the positive pressure operation it is desired to open door 32 and lower boat 28 into controlled environment chamber 52, an operator provides a request to open the door to controller 170 via a keyboard (not shown) or other known means. Such request is indicated by step 200 in the flow diagram in FIG. 9, which Figure describes the flow of the software routine used by controller 170 in controlling the operation of the door interlock.

Figure 9:
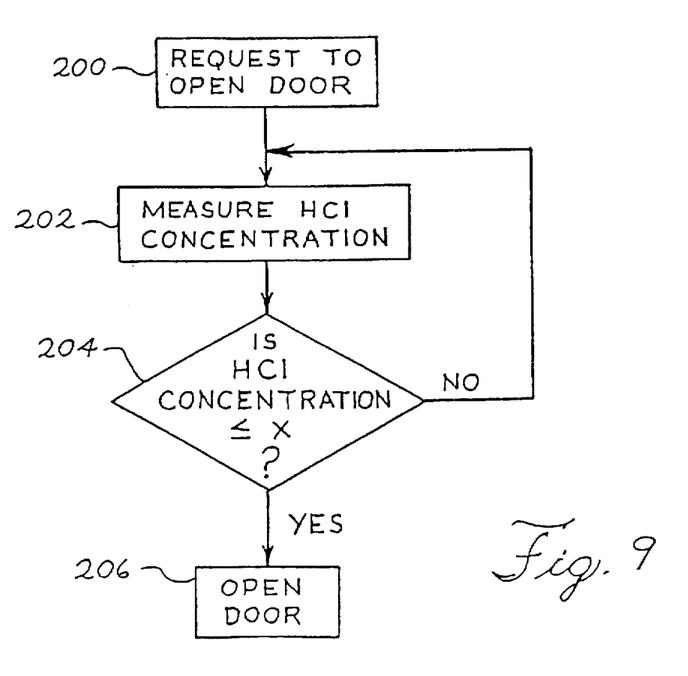
FIG. 9 is a flow diagram of the routine followed by the controller in controlling the door interlock functions.

Next, the concentration of HCl gas in tube 60, and hence in process chamber 24 coupled therewith, is measured using information provided by HCl sensor 74, as indicated by step 202. After a request to open door 32 is received, and typically well before such a request is provided, exhaust system 20 is operated so as to maintain a circumferentially substantially uniform flow of exhaust through tube 60. Thus, the presence of non-uniform concentrations of exhaust gases in tube 60 is avoided ensuing accurate HCl gas monitoring occurs.

If, as indicated by step 204, it is determined that the HCl concentration in tube 60 is greater than a predetermined amount "X", e.g., greater than 2.5 ppm, (SPPM TLV) then the routine loops back to step 202, evacuation of exhaust continues, and the request to open door 32 is not implemented. On the other hand, if at step 204 it is determined that the HCl concentration in tube 60 is less than or equal to predetermined amount X, then the request to open door 32 is implemented, as indicated by step 206. Thus, at step 206, controller 170 provides a signal to actuation assembly 33 causing the latter to move door 32 from the closed position illustrated in FIG. 8 to an open position (not shown) where process chamber 24 is in fluid communication with the interior of controlled environment chamber 52. Because specific software code for implementing the operations illustrated by the flow diagram of FIG. 9 could be readily generated by one of ordinary skill in the art based on the foregoing description, such code is not provided herein.

Although in a preferred embodiment, valve assembly 120 comprises a solid piston 122 that is moved along its axis so as to alternatively (a) confront and (b) be axially spaced from aperture 70 in tube 60, other valve assemblies may also be used. However, such alternative assemblies are encompassed by the present invention so long as the assembly is operable for extended periods of time in the presence of gaseous HCl and the assembly is designed to create a circumferentially uniform, relatively high velocity flow of exhaust gases from the interior of tube 60 through aperture 70 such that backstreaming and the build-up of non-uniform concentrations of exhaust gases in tube 60 will not occur, as described above. Valve assemblies with alternative functional characteristics have been considered and determined to be unsatisfactory. For instance, consideration was given to significantly reducing the size of gap 130 and maintaining a limited flow of exhaust gas from the interior of tube 60 through aperture 70 during positive pressure operations by positioning piston 122 so that aperture 70 remains partially open. Unfortunately, it is believed that circumferentially uniform exhaust gas flow could not be maintained with such an approach, since the majority of the exhaust gases would be withdrawn from that portion of the interior of tube 60 adjacent the open portion of aperture 70. As a result, exhaust gases would likely accumulate in other portions of the interior of tube 60, possibly adjacent the HCl sensor 74. Such accumulation of exhaust gas would likely also occur if the size of gap 130 was significantly reduced and the interior of tube 60 was coupled with the interior of tube of 80 via a pipe (not shown) having a relatively small inside diameter (i.e., significantly smaller than the inside diameter of tube 60), since circumferentially uniform flow would likely not be maintained.

It is preferred that piston 122 be positioned in portions of exhaust system 20 where HCl is always in the gaseous state to ensure that the velocity of gases escaping through gap 130 is sufficiently high to prevent the accumulation of HCl gases in tube 60. If piston 122 is positioned in a portion of exhaust system 20 where HCl is no longer in the gaseous state, e.g., in tube portion 96b, the presence of hydrochloric acid and water "droplets" in the exhaust flow would likely reduce the velocity of exhaust gases flowing through gap 130 to an extent sufficient to permit the accumulation of HCl gas in upstream portions of the exhaust system, thereby limiting the ability to accurately measure the concentration of HCl gas in process chamber 24.

Because certain changes may be made in the above described apparatus and method without departing from the scope of the invention herein involved, it is intended that all matter contained in the foregoing description or shown in the accompanying drawings shall be interpreted in an illustrative and not in a limiting sense.

What is claimed is:

1. A method of operating a furnace having a process chamber in which high temperature process operations may be performed at positive or negative pressures with respect to the environment in which the furnace is located and an exhaust port through which gases in the process chamber may be evacuated from the furnace, the method comprising the steps of:

(a) loading one or more objects into the process chamber;

(b) maintaining said process chamber at a negative pressure with respect to the environment in which said furnace is located;

(c) subjecting said one or more objects to a first process;

(d) maintaining said process chamber at a positive pressure with respect to the environment in which said furnace is located;

(e) subjecting said one or more objects to a second process; and wherein said step (d) involves evacuating gases from said process chamber through an exhaust tube in fluid communication with said process chamber and a piston slidably mounted in said exhaust tube and operable between open and closed positions for permitting exhaust gases to flow from said exhaust tube through an outlet aperture of said exhaust tube when said piston is in said open position and for restricting the flow of exhaust gases from said exhaust tube through said outlet aperture when said piston is in said closed position, said exhaust tube being coupled with the exhaust port of the furnace in a manner ensuring a substantially uniform exhaust gas concentration is maintained within a selected region of the exhaust tube.

2. A method according to claim 1, further comprising the step of monitoring the concentration of a selected gas in said selected region of the exhaust system.

* * * * *